(12) United States Patent
Choi

(10) Patent No.: US 6,618,252 B2
(45) Date of Patent: Sep. 9, 2003

(54) HEAT SINK OF MODULE WITH BUILT-IN IC

(75) Inventor: Gyu Hwan Choi, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/083,393

(22) Filed: Feb. 27, 2002

(65) Prior Publication Data

US 2002/0186542 A1 Dec. 12, 2002

(30) Foreign Application Priority Data

Jun. 11, 2001 (KR) ........................................ 2001-32519

(51) Int. Cl.[7] ................................................. H05K 7/20
(52) U.S. Cl. ....................... 361/719; 174/252; 257/713; 334/85; 361/705
(58) Field of Search ................................ 174/16.3, 252; 165/80.3, 185; 257/706, 707, 713; 361/704, 705, 707, 715, 717–719, 752; 334/15, 85

(56) References Cited

U.S. PATENT DOCUMENTS

| | | | | |
|---|---|---|---|---|
| 3,818,349 A | * | 6/1974 | Ma | 455/347 |
| 4,404,617 A | * | 9/1983 | Ohyama et al. | 361/818 |
| 4,535,385 A | * | 8/1985 | August et al. | 361/711 |
| 4,841,414 A | * | 6/1989 | Hibino et al. | 361/818 |
| 5,467,251 A | * | 11/1995 | Katchmar | 361/719 |
| 5,581,443 A | * | 12/1996 | Nakamura et al. | 361/705 |
| 5,977,626 A | * | 11/1999 | Wang et al. | 257/707 |
| 6,278,615 B1 | | 8/2001 | Brenzina et al. | |

* cited by examiner

Primary Examiner—Gerald Tolin
(74) Attorney, Agent, or Firm—Lowe Hauptman Gilman & Berner, LLP

(57) ABSTRACT

Disclosed is a heat sink of a module with a built-in integrated circuit (IC) including a circuit board formed with a plurality of first through holes extending from an upper surface of the circuit board to a lower surface of the circuit board, a metal-attached IC mounted to the lower surface of the circuit board and attached at an upper surface thereof with a metallic member, a first conductive material provided at the upper surface of the circuit board, the first conductive material filling the first through holes so that it is in contact with the metallic member, a module case adapted to receive the circuit board therein while including upper and lower cases made of a metal, and a depressed structure formed at the upper case and adapted to allow the first conductive material on the upper surface of the circuit board to be in contact with the upper case. By this configuration, a heat transfer path is formed which extends from the metal-attached IC to the module case via conductive materials, thereby allowing heat generated from the metal-attached IC to be efficiently outwardly discharged via the module case.

24 Claims, 6 Drawing Sheets

HEAT SINK OF MODULE WITH BUILT-IN IC

BACKGROUND OF THE INVENTION

1. Field of the Invention

The present invention relates to a heat sink of a module with a built-in IC, and more particularly to a heat sink of a module with a built-in IC which includes a depressed structure formed at a module case receiving an IC, in particular, a metal-attached IC, so as to form a heat transfer path extending from the metal-attached IC to the module case via conductive materials, thereby allowing heat generated from the metal-attached IC to be efficiently outwardly discharged via the module case.

2. Description of the Related Art

Generally, a cable modem, so called a "cable modem box", is mounted to a personal computer (PC) while being connected to an Internet connection cable so as to allow the user to have access to the Internet. Such a cable modem can be used in systems requiring access to the Internet, for example, TVs or VCRs, in addition to PCs.

An example of such a cable modem is a cable modem tuner. In order to achieve an improvement in performance and productivity, such a cable modem tuner is manufactured to have a modular structure. In such a modular cable modem tuner, a highly integrated IC is built in a circuit board enclosed in a module case.

FIG. 1 is a perspective view illustrating the outer structure of a conventional cable modem tuner. Referring to FIG. 1, the conventional cable modem tuner, which is denoted by the reference numeral 10, includes a metal case 11 so that it has a modular structure. Pins 13 extend outwardly from a side surface of the metal case 11 while being connected to a circuit board (not shown) mounted in the metal case 11. A plurality of through holes 12 are formed at one major surface of the metal case 11 in order to outwardly discharge heat generated in the metal case 11.

In order to obtain a miniature modular structure, the internal circuit of the cable model tuner module should be implemented using a highly integrated IC. In this case, however, it is also necessary to implement a heat sink because the highly integrated IC generates a large amount of heat. To this end, simple holes are formed at the metal case in the above mentioned conventional cable modem tuner module. However, such holes have an insufficient heat discharging effect. For this reason, the conventional cable modem tuner module has a problem in that a degradation in performance occurs due to thermal noise caused by heat generated from the internal IC.

SUMMARY OF THE INVENTION

Therefore, the present invention has been made in view of the above mentioned problems, and an object of the invention is to provide a heat sink of a module with a built-in IC which includes a depressed structure formed at a module case receiving an IC, in particular, a metal-attached IC, so as to form a heat transfer path extending from the metal-attached IC to the module case via conductive materials, thereby allowing heat generated from the metal-attached IC to be efficiently outwardly discharged via the module case.

In accordance with one aspect, the present invention provides a heat sink of a module with a built-in integrated circuit (IC) comprising: a circuit board formed with a plurality of first through holes extending from an upper surface of the circuit board to a lower surface of the circuit board; a metal-attached IC mounted to the lower surface of the circuit board and attached at an upper surface thereof with a metallic member; a first conductive material provided at the upper surface of the circuit board, the first conductive material filling the first through holes so that it is in contact with the metallic member; a module case adapted to receive the circuit board therein while including upper and lower cases made of a metal; and a depressed structure formed at the upper case and adapted to allow the first conductive material on the upper surface of the circuit board to be in contact with the upper case.

Preferably, the depressed structure is integral with the upper case. The depressed structure may have a multi-step structure. The depressed structure may have a plurality of second through holes extending from an upper surface of the depressed structure to a lower surface of the depressed structure at a region where the depressed structure is in contact with the first conductive material. In this case, the heat sink may further comprise a second conductive material provided at the upper surface of the depressed structure, the second conductive material filling the second through holes so that it is in contact with the first conductive material.

Preferably, the contact area between the depressed structure and the first conductive material is substantially equal to the contact area between the metal-attached IC and the circuit board. The first and second conductive materials may be provided using a soldering process.

In accordance with another aspect, the present invention provides a heat sink of a module with a built-in integrated circuit (IC) comprising: a circuit board formed with a plurality of first through holes extending from an upper surface of the circuit board to a lower surface of the circuit board; a metal-attached IC mounted to the lower surface of the circuit board and attached at an upper surface thereof with a metallic member; a first conductive material provided at the upper surface of the circuit board, the first conductive material filling the first through holes so that it is in contact with the metallic member; a module case adapted to receive the circuit board therein while including upper and lower cases made of a metal; and a depressed structure formed at the upper case and adapted to allow the first conductive material on the upper surface of the circuit board to be in contact with the upper case, the depressed structure being formed by partially cutting out a portion of the upper case, and downwardly bending the cut-out portion of the upper case.

In this case, the depressed structure may have a plurality of second through holes extending from an upper surface of the depressed structure to a lower surface of the depressed structure at a region where the depressed structure is in contact with the first conductive material. The heat sink may further comprise a second conductive material provided at the upper surface of the depressed structure, the second conductive material filling the second through holes so that it is in contact with the first conductive material.

The contact area between the depressed structure and the first conductive material is substantially equal to the contact area between the metal-attached IC and the circuit board. The first and second conductive materials may be provided using a soldering process.

BRIEF DESCRIPTION OF THE DRAWINGS

The above objects, and other features and advantages of the present invention will become more apparent after a reading of the following detailed description when taken in conjunction with the drawings, in which:

FIGS. 3a and 3b are cross-sectional views taken along the line A—A of FIG. 2, in which FIG. 3a shows an exploded structure of the cable modem tuner module, and FIG. 3b shows an assembled structure of the cable modem tuner module;

FIGS. 5a and 5b are cross-sectional views taken along the line A—A of FIG. 4, in which FIG. 5a shows an exploded structure of the cable modem tuner module, and FIG. 5b shows an assembled structure of the cable modem tuner module; and FIGS. 6a to 6c are views illustrating a pin arrangement of the cable modem tuner module, in which FIG. 6a is a plan view, FIG. 6b is a front view, and FIG. 6c is a left side view.

DESCRIPTION OF THE PREFERRED EMBODIMENTS

Now, embodiments of the present invention relating to a heat sink of a module with a built-in IC will be described in detail with reference to the annexed drawings.

Figure 1:
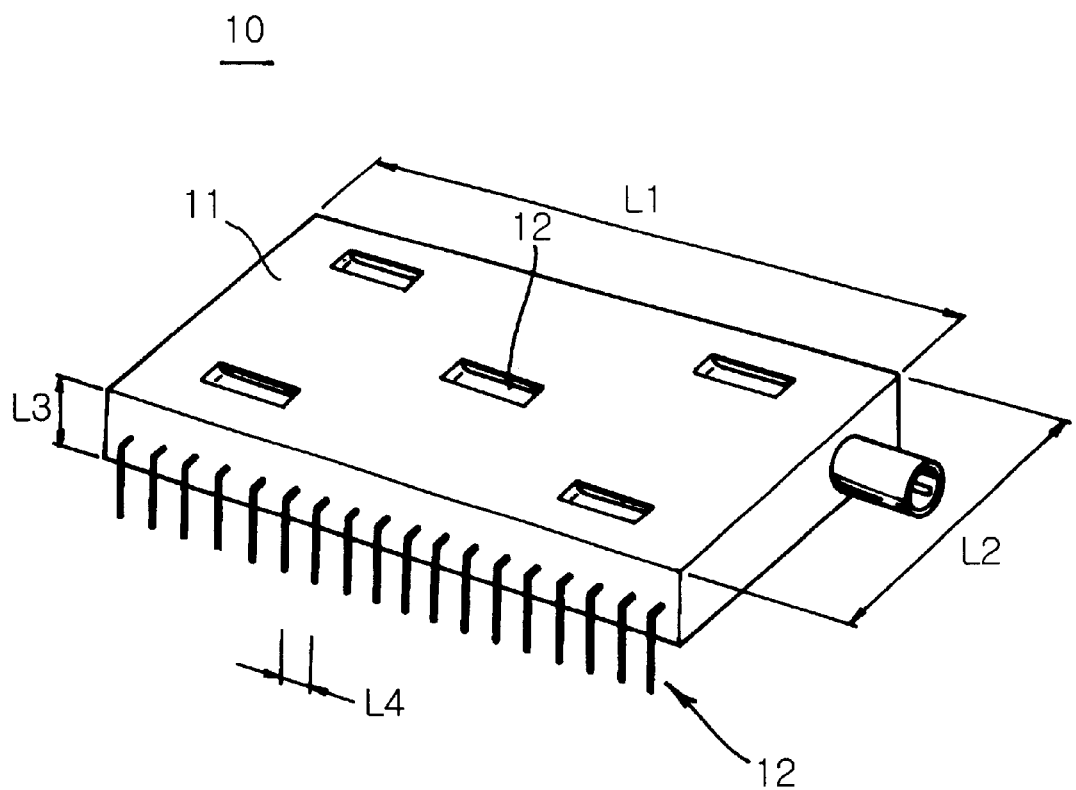
FIG. 1 is a perspective view illustrating the outer structure of a conventional cable modem tuner.
Figure 2:
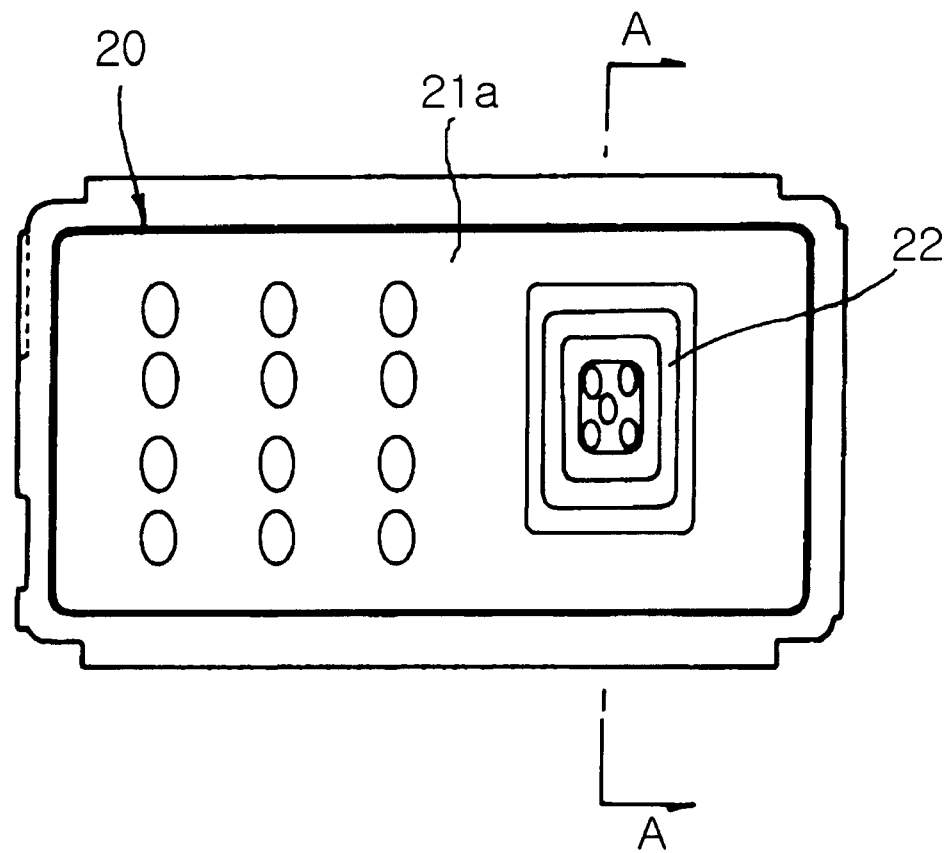
FIG. 2 is a plan view illustrating the structure of a heat sink provided at a cable modem tuner module in accordance with a first embodiment of the present invention.
Figure 3A:
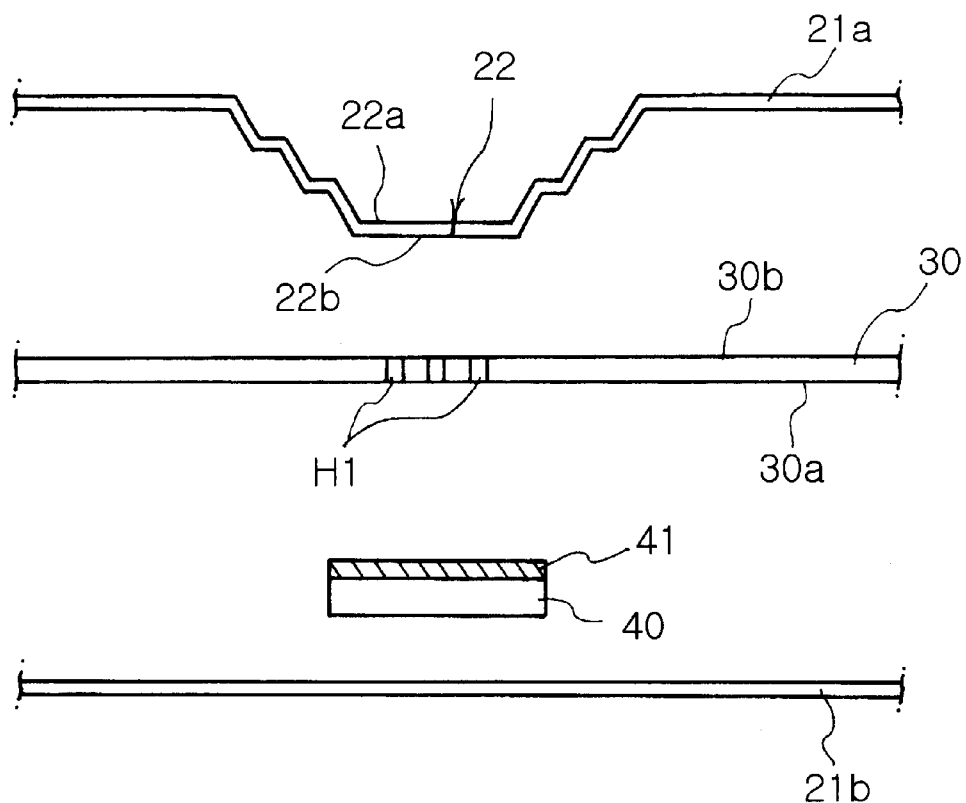
Figure 3B:
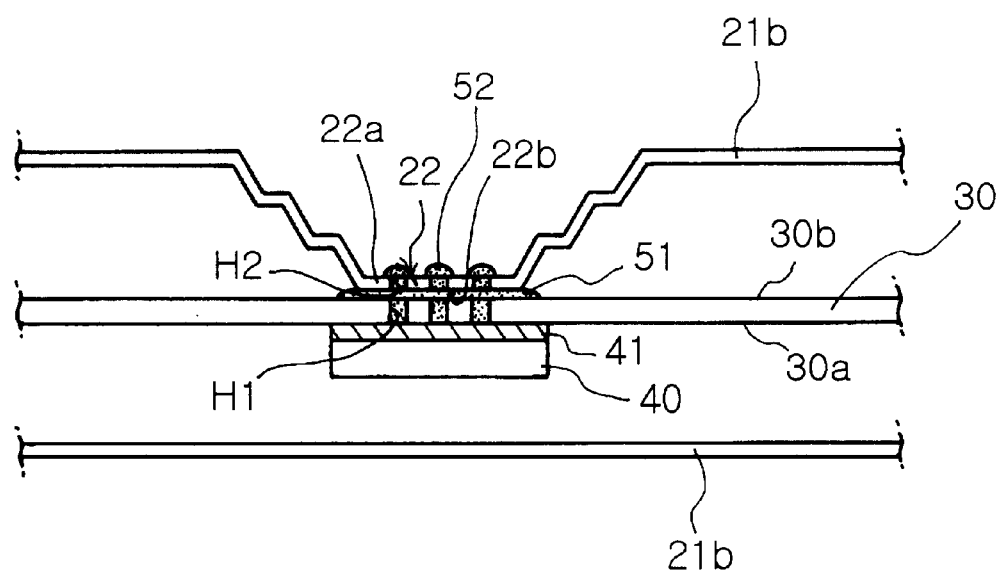

FIG. 2 is a plan view illustrating the structure of a heat sink provided at a cable modem tuner module in accordance with a first embodiment of the present invention. FIGS. 3a and 3b are cross-sectional views taken along the line A—A of FIG. 2. FIG. 3a shows an exploded structure of the cable modem tuner module, whereas FIG. 3b shows an assembled structure of the cable modem tuner module.

Referring to FIGS. 2, 3a and 3b, the heat sink of the cable modem tuner module according to the first embodiment of the present invention includes a circuit board 30, for example, a printed circuit board (PCB), formed with a plurality of first through holes H1 extending from an upper surface 30a of the circuit board 30 to a lower surface 30b of the circuit board 30. The heat sink also includes a metal-attached IC 40 mounted to the lower surface 30b of the circuit board 30 and attached at an upper surface thereof with a metallic member 41. A first conductive material 51 is provided at the upper surface 30a of the circuit board 30. The first conductive material 51 fills the first through holes H1 so that it is in contact with the metallic member 41. The heat sink further includes a module case 20 adapted to receive the circuit board 30 therein while including upper and lower cases 21a and 21b made of a metal, and a depressed structure 22 formed at the upper case 21a and adapted to allow the first conductive material 51 on the upper surface 30a of the circuit board 30 to be in contact with the upper case 21a.

Preferably, the depressed structure 22 is integral with the upper case 21a, taking into consideration manufacturing processes and heat transfer characteristics. The depressed structure 22 also preferably has a multi-step structure. In particular, the depressed structure 22 may have a double-step structure in order to achieve an easy manufacture thereof.

The depressed structure 22 has a plurality of second through holes H2 extending from an upper surface 22a of the depressed structure 22 to a lower surface 22b of the depressed structure 22 at a region where the depressed structure 22 is in contact with the first conductive material 51. A second conductive material 52 is provided at the upper surface 22a of the depressed structure 22. The second conductive material 52 fills the second through holes H2 so that it is in contact with the first conductive material 51. Accordingly, the upper case 21a is thermally connected with the metallic member 41 of the metal-attached IC 40 via the first and second conductive materials 51 and 52. Thus, heat generated from the metal-attached IC 40 is transferred to the upper case 21a via the metallic member 41, first and second conductive materials 51 and 52, and depressed structure 22, in this order.

In order to more efficiently transfer the heat generated from the metal-attached IC 40 to the module case 20, it is preferred that the contact area between the depressed structure 22 and the first conductive material 51 be substantially equal to the contact area between the metal-attached IC 40 and the circuit board 30.

Although there is no specific limitation as to the provision of the first and second conductive materials 51 and 52, it is preferable to provide those conductive materials 51 and 52 using a soldering process in order to achieve an easy workability. Here, it is noted that such a preference is also applied to a second embodiment of the present invention which will be described hereinafter.

In accordance with the heat sink having the above described configuration according to the first embodiment of the present invention, heat generated from the IC mounted to the circuit board is transferred to the depressed structure of the metal case via the metallic member, the first conductive material filling the first through holes, and the second conductive material filling the second through holes. The heat transferred to the depressed structure is spread over the entire portion of the metal case, so that it is efficiently discharged to the atmosphere.

Where the heat sink having the above described depressed structure is applied to a module having a plurality of ICs, it may be formed at each IC. Alternatively, the heat sink may be selectively formed at an IC generating a maximum amount of heat.

Figure 4:
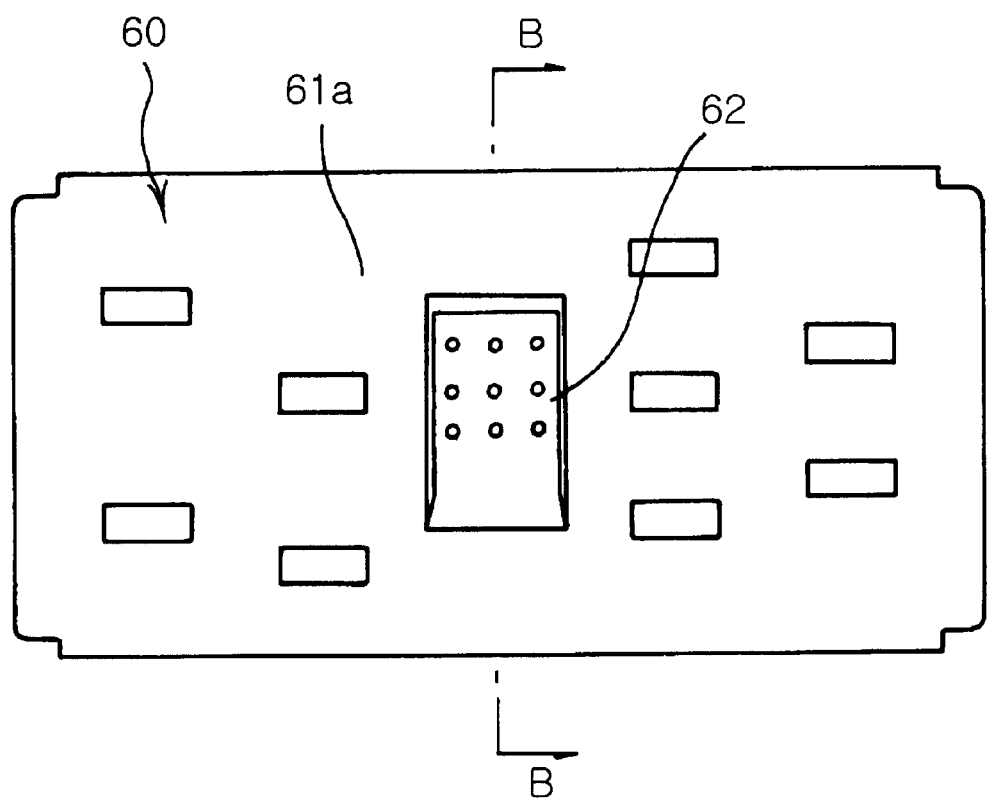
FIG. 4 is a plan view illustrating the structure of a heat sink provided at a cable modem tuner module in accordance with a second embodiment of the present invention.
Figure 5:
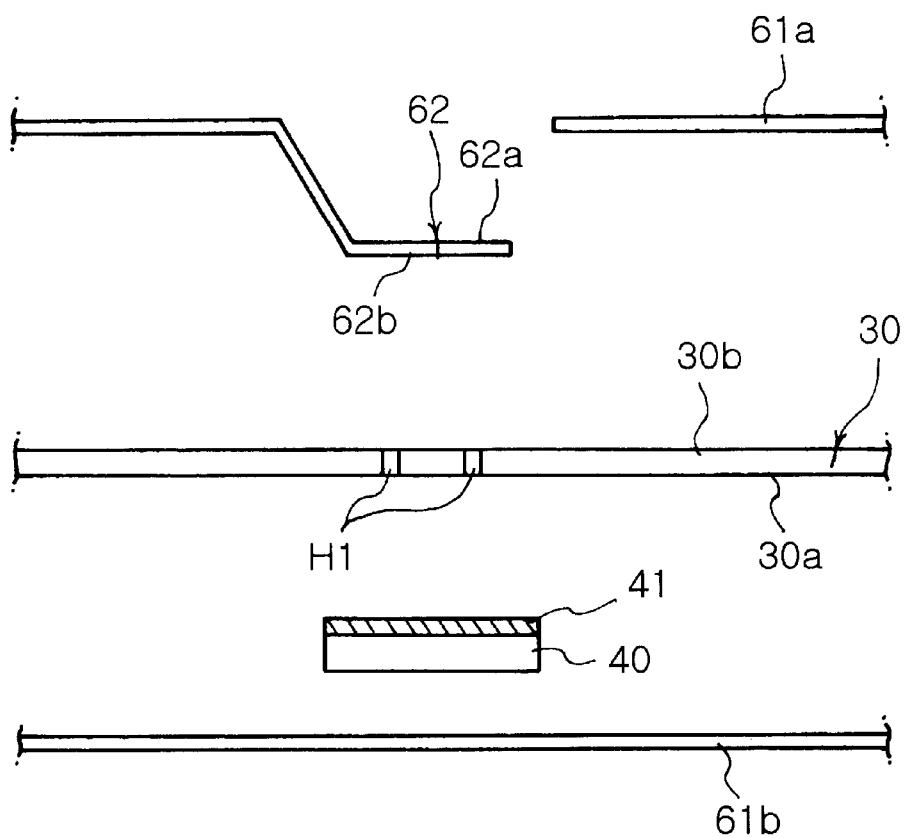
Figure 5B:
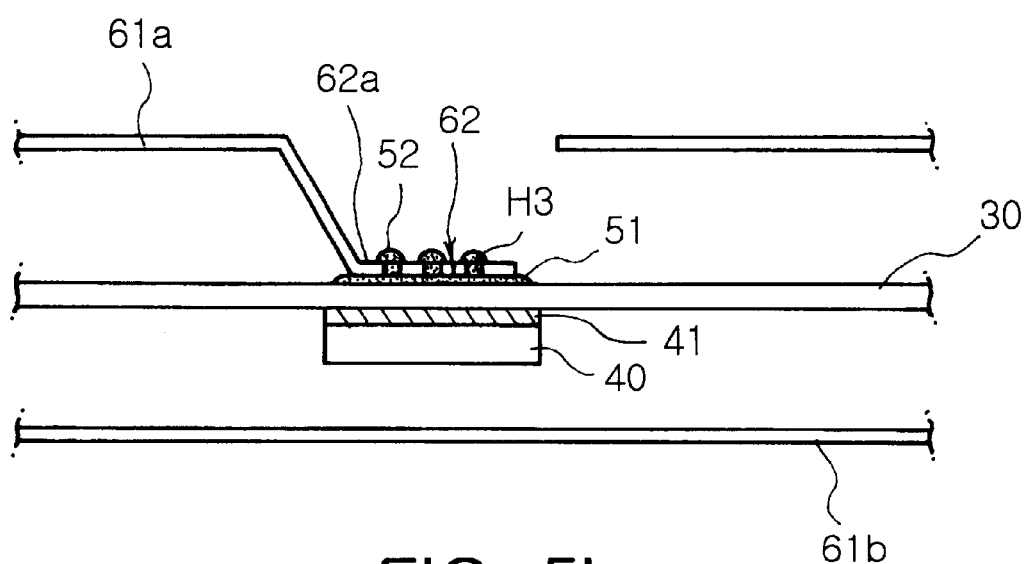

FIG. 4 is a plan view illustrating the structure of a heat sink provided at a cable modem tuner module in accordance with a second embodiment of the present invention. FIGS. 5a and 5b are cross-sectional views taken along the line A—A of FIG. 4. FIG. 5a shows an exploded structure of the cable modem tuner module, whereas FIG. 5b shows an assembled structure of the cable modem tuner module. In FIGS. 4, 5a and 5b, reference numerals respectively corresponding to those in FIGS. 2, 3a and 3b are denoted by the same reference numerals.

Referring to FIGS. 4, 5a and 5b, the heat sink of the cable modem tuner module according to the second embodiment of the present invention includes a circuit board 30, for example, a PCB, formed with a plurality of first through holes H1 extending from an upper surface 30a of the circuit board 30 to a lower surface 30b of the circuit board 30. The heat sink also includes a metal-attached IC 40 mounted to the lower surface 30b of the circuit board 30 and attached at an upper surface thereof with a metallic member 41. A first conductive material 51 is provided at the upper surface 30a of the circuit board 30. The first conductive material 51 fills the first through holes H1 so that it is in contact with the metallic member 41. The heat sink further includes a module case 60 adapted to receive the circuit board 30 therein while including upper and lower cases 61a and 61b made of a metal, and a depressed structure 62 formed at the upper case 61a and adapted to allow the first conductive material 51 on the upper surface 30a of the circuit board 30 to be in contact with the upper case 61a. The depressed structure 62 is formed by partially cutting out a portion of the upper case 61a, and downwardly bending the cut-out portion of the upper case 61a.

The depressed structure 62 has a plurality of second through holes H3 extending from an upper surface 62a of the depressed structure 62 to a lower surface 62b of the depressed structure 62 at a region where the depressed structure 62 is in contact with the first conductive material 51. A second conductive material 52 is provided at the upper surface 62a of the depressed structure 62. The second conductive material 62 fills the second through holes H3 so that it is in contact with the first conductive material 51. Accordingly, the upper case 21a is thermally connected the metallic member 41 of the metal-attached IC 40 via the first and second conductive materials 51 and 52. Thus, heat generated from the metal-attached IC 40 is transferred to the upper case 61a via the metallic member 41, first and second conductive materials 51 and 52, and depressed structure 62, in this order.

In order to more efficiently transfer the heat generated from the metal-attached IC 40 to the module case 60, it is preferred that the contact area between the depressed structure 62 and the first conductive material 51 be substantially equal to the contact area between the metal-attached IC 40 and the circuit board 30.

Although there is no specific limitation as to the provision of the first and second conductive materials 51 and 52, it is preferable to provide those conductive materials 51 and 52 using a soldering process in order to achieve an easy workability.

Although the heat sink according to the present invention has been described as being applied to a metal-attached IC, its application is not limited thereto. In accordance with the present invention, the heat sink may be applied to elements generating a large amount of heat. Since a highly integrated IC is a representative of elements generating a large amount of heat, the present invention has been described in conjunction with a metal-attached IC which is formed by attaching a metal member to the highly integrated IC. Also, the heat sink of the present invention may be applied to various modules without being limited to specific modules. For example, the heat sink of the present invention is applicable to satellite tuner modules, cable tuner modules, television tuner modules, VTR tuner modules, and modules associated with other Web boxes and modem boxes, in addition to the above described cable modem tuner modules.

Figure 6B:
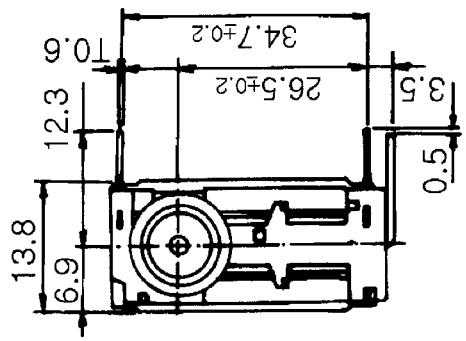
Figure 6A:
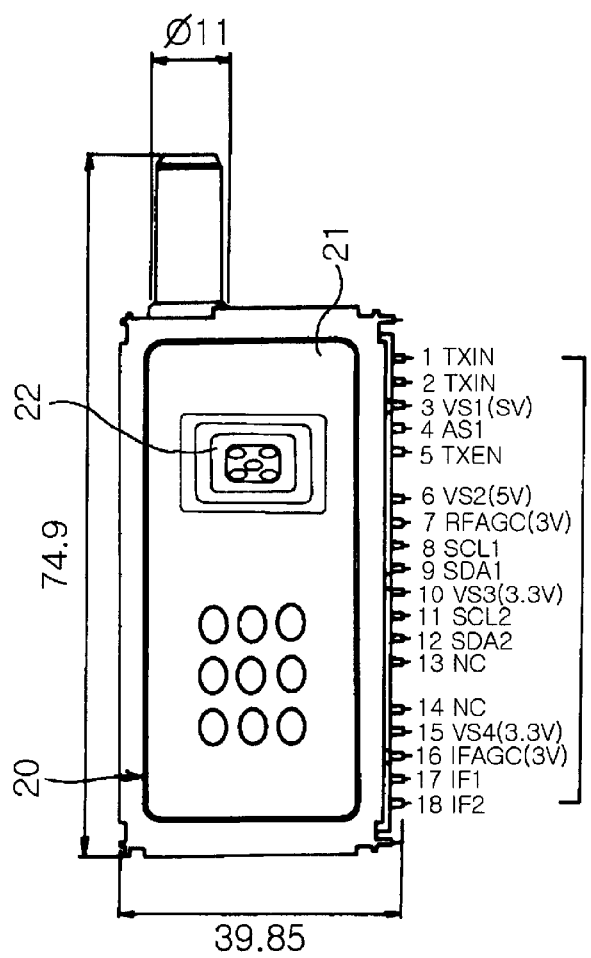
Figure 6C:
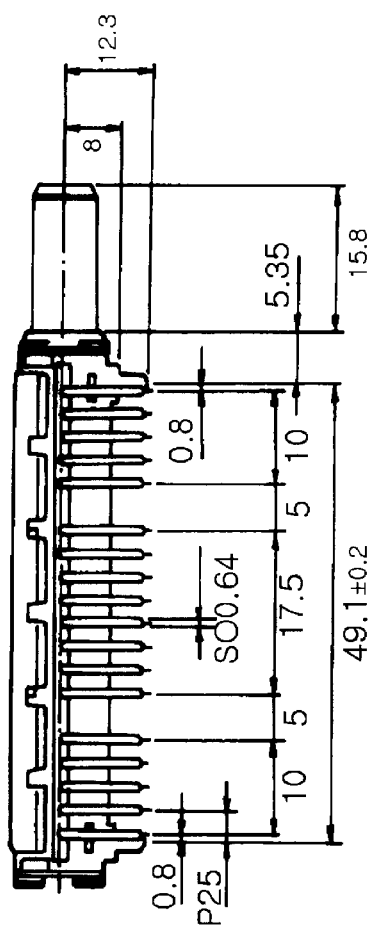

Now, the pin arrangement of a cable modem tuner module, that is, a module to which the heat sink of the present invention is applied, will be described. FIGS. 6a to 6c are views illustrating the pin arrangement of the cable modem tuner module, in which FIG. 6a is a plan view, FIG. 6b is a front view, and FIG. 6c is a left side view.

Referring to FIGS. 6a to 6c, the cable modem tuner module includes an IC, a circuit board mounted with desired elements and circuits, and a metal module case 20 including upper and lower cases to enclose the IC and circuit board.

As shown in FIGS. 6a and 6b, the metal module case 20 includes a plurality of pins assigned with Nos. 1 to 18 and formed at one side surface of the metal module case 20 while being aligned with one another. Each of the first through eighteenth pins is connected to the circuit board arranged in the interior of the metal module case 20 while extending outwardly by a desired length. The space between adjacent ones of the first through eighteenth pins, P25, is set to be about 3 mm or less. This space, that is, the pin pitch, corresponds to ½ or less of the pin pitch in conventional cases. Accordingly, the cable modem tuner module, to which the heat sink of the present invention is applied, can have a reduced size because the pitch among the aligned pins is reduced. Thus, it is possible to manufacture a cable modem tuner module with a super-miniature size.

For example, it is possible to manufacture a cable modem tuner module having a pin pitch of about 2.5 mm, claim 16, further comprising:

a second conductive material provided on the upper surface of the depressed structure, the second conductive material filling the second through holes so that the second conductive material is in contact with the first conductive material.

What is claim is:

1. A heat sink of a module with a built-in integrated circuit (IC), said heat sink comprising:

a circuit board formed with a plurality of first through holes extending from an upper surface of the circuit board to a lower surface of the circuit board;

a metal-attached IC mounted to the lower surface of the circuit board via a metallic member attached to an upper surface of the metal-attached IC;

a first conductive material provided on the upper surface of the circuit board, the first conductive material filling the first through holes so that the first conductive material is in contact with the metallic member;

a module case for receiving the circuit board therein while including upper and lower cases made of a metal; and a depressed structure formed at the upper case for contacting the first conductive material on the upper surface of the circuit board with the upper case.

2. The heat sink according to claim 1, wherein the depressed structure is integral with the upper case.

3. The heat sink according to claim 2, wherein the depressed structure has a multi-step structure.

4. The heat sink according to claim 3, wherein the depressed structure has a plurality of second through holes extending from an upper surface of the depressed structure to a lower surface of the depressed structure at a region where the depressed structure is in contact with the first conductive material.

5. The heat sink according to claim 4, further comprising:

a second conductive material provided on the upper surface of the depressed structure, the second conductive material filling the second through holes so that the second conductive material is in contact with the first conductive material.

6. The heat sink according to claim 5, wherein the contact area between the depressed structure and the first conductive material is substantially equal to the contact area between the metal-attached IC and the circuit board.

7. The heat sink according to claim 6, wherein the first and second conductive materials are provided using a soldering process.

8. A heat sink of a cable modem module tuner with a built-in integrated circuit (IC) said heat sink comprising:

a circuit board formed with a plurality of first through holes extending from an upper surface of the circuit board to a lower surface of the circuit board;

a metal-attached IC mounted to the lower surface of the circuit board via a metallic member attached to an upper surface of the metal-attached IC;

a first conductive material provided on the upper surface of the circuit board, the first conductive material filling the first through holes so that the first conductive material is in contact with the metallic member;

a module case for receiving the circuit board therein while including upper and lower cases made of a metal; and a depressed structure formed at the upper case for contacting the first conductive material on the upper surface of the circuit board with the upper case.

9. The heat sink according to claim 8, wherein the depressed structure is integral with the upper case.

10. The heat sink according to claim 9, wherein the depressed structure has a multi-step structure.

11. The heat sink according to claim 10, wherein the depressed structure has a plurality of second through holes extending from an upper surface of the depressed structure to a lower surface of the depressed structure at a region where the depressed structure is in contact with the first conductive material.

12. The heat sink according to claim 11, further comprising:

a second conductive material provided on the upper surface of the depressed structure, the second conductive material filling the second through holes so that the second conductive material is in contact with the first conductive material.

13. The heat sink according to claim 12, wherein the contact area between the depressed structure and the first conductive material is substantially equal to the contact area between the metal-attached IC and the circuit board.

14. The heat sink according to claim 13, wherein the first and second conductive materials are provided using a soldering process.

15. A heat sink of a module with a built-in integrated circuit (IC) comprising:

a circuit board formed with a plurality of first through holes extending from an upper surface of the circuit board to a lower surface of the circuit board;

a metal-attached IC mounted to the lower surface of the circuit board via a metallic member attached to an upper surface of the metal-attached IC;

a first conductive material provided on the upper surface of the circuit board, the first conductive material filling the first through holes so that the first conductive material is in contact with the metallic member;

a module case for receiving the circuit board therein while including upper and lower cases made of a metal; and a depressed structure formed at the upper case for contacting the first conductive material on the upper surface of the circuit board with the upper case, the depressed structure being formed by partially cutting out a portion of the upper case, and downwardly bending the cut-out portion of the upper case.

16. The heat sink according to claim 15, wherein the depressed structure has a plurality of second though holes extending from an upper surface of the depressed structure to a lower surface of the depressed structure at a region where the depressed structure is in contact with the first conductive material.

17. The heat sink according to claim 16, further comprising:

a second conductive material provided on the upper surface of the depressed structure, the second conductive material filling the second through holes so that the second conductive material is in contact with the first conductive material.

18. The heat sink according to claim 17, wherein the contact area between the depressed structure and the first conductive material is substantially equal to the contact area between the metal-attached IC and the circuit board.

19. The heat sink according to claim 18, wherein the first and second conductive materials are provided using a soldering process.

20. A heat sink of a cable modem tuner module with a built-in integrated circuit (IC), said heat sink comprising:

a circuit board formed with a plurality of first through holes extending from an upper surface of the circuit board to a lower surface of the circuit board;

a metal-attached IC mounted to the lower surface of the circuit board via a metallic member attached to an upper surface of the metal-attached IC;

a first conductive material provided on the upper surface of the circuit board, the first conductive material filling the first through holes so that it the first conductive material is in contact with the metallic member; a module case for receiving the circuit board therein while including upper and lower cases made of a metal; and a depressed structure formed at the upper case for contacting the first conductive material on the upper surface of the circuit board with the upper case, the depressed structure being formed by partially cutting out a portion of the upper case, and downwardly bending the cut-out portion of the upper case.

21. The heat sink according to claim 20, wherein the depressed structure has a plurality of second through holes extending from an upper surface of the depressed structure to a lower surface of the depressed structure at a region where the depressed structure is in contact with the first conductive material.

22. The heat sink according to claim 21, further comprising:

a second conductive material provided on the upper surface of the depressed structure, the second conductive material filling the second through holes so that the second conductive material is in contact with the first conductive material.

23. The heat sink according to claim 22, wherein the contact area between the depressed structure and the first conductive material is substantially equal to the contact area between the metal-attached IC and the circuit board.

24. The heat sink according to claim 23, wherein the first and second conductive materials are provided using a soldering process.

* * * * *